(12) United States Patent
Sheperek et al.

(10) Patent No.: US 11,842,772 B2
(45) Date of Patent: *Dec. 12, 2023

(54) VOLTAGE BIN BOUNDARY CALIBRATION AT MEMORY DEVICE POWER UP

(71) Applicant: MICRON TECHNOLOGY, INC., Boise, ID (US)

(72) Inventors: Michael Sheperek, Longmont, CO (US); Bruce A. Liikanen, Berthoud, CO (US); Steve Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/857,942

(22) Filed: Jul. 5, 2022

(65) Prior Publication Data

US 2022/0336021 A1    Oct. 20, 2022

Related U.S. Application Data

(63) Continuation of application No. 17/022,908, filed on Sep. 16, 2020, now Pat. No. 11,404,124.

(51) Int. Cl.
| | |
|---|---|
| *G11C 16/30* | (2006.01) |
| *G11C 16/10* | (2006.01) |
| *G11C 16/26* | (2006.01) |
| *G11C 16/32* | (2006.01) |
| *G06F 12/02* | (2006.01) |
| *G06F 12/0882* | (2016.01) |
| *G11C 16/34* | (2006.01) |

(52) U.S. Cl.
CPC .......... *G11C 16/10* (2013.01); *G06F 12/0246* (2013.01); *G06F 12/0882* (2013.01); *G11C 16/26* (2013.01); *G11C 16/30* (2013.01); *G11C 16/32* (2013.01); *G11C 16/3404* (2013.01); *G06F 2212/7207* (2013.01); *G11C 2207/2254* (2013.01)

(58) Field of Classification Search
CPC ......... G11C 16/10; G11C 16/26; G11C 16/30; G11C 16/32; G11C 16/3404; G11C 2207/2254; G06F 12/0246; G06F 12/0882; G06F 2212/7207
USPC ..................................... 365/189.11
See application file for complete search history.

(56) References Cited

U.S. PATENT DOCUMENTS

| | | | |
|---|---|---|---|
| 11,404,124 B2 * | 8/2022 | Sheperek | G11C 29/52 |
| 2010/0131697 A1 | 5/2010 | Alrod et al. | |
| 2017/0017588 A1 | 1/2017 | Frid et al. | |
| 2019/0066802 A1 | 2/2019 | Malshe et al. | |
| 2020/0066361 A1 | 2/2020 | Ioannou et al. | |

\* cited by examiner

*Primary Examiner* — Huan Hoang
(74) *Attorney, Agent, or Firm* — Lowenstein Sandler LLP

(57) ABSTRACT

A first bin boundary for a first voltage bin associated with a die of a memory device is identified. The first bin boundary corresponds to a first block family associated with the first voltage bin. A first bin boundary offset between the first block family and a second block family is determined. The first bin boundary is updated based on the first bin boundary offset.

20 Claims, 16 Drawing Sheets

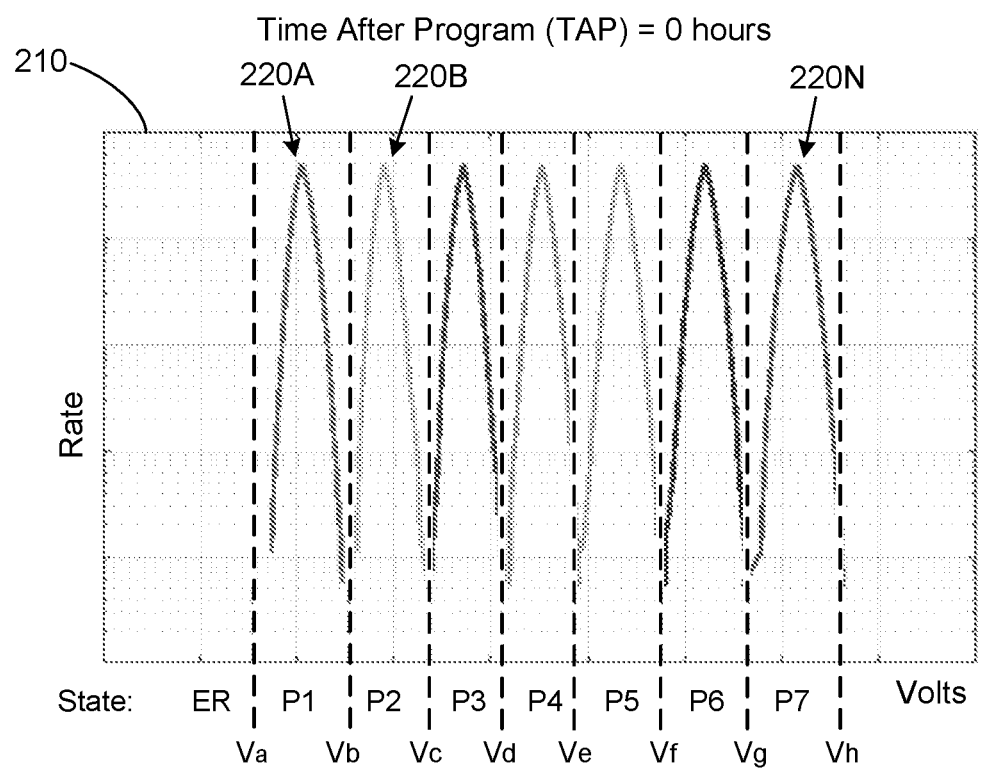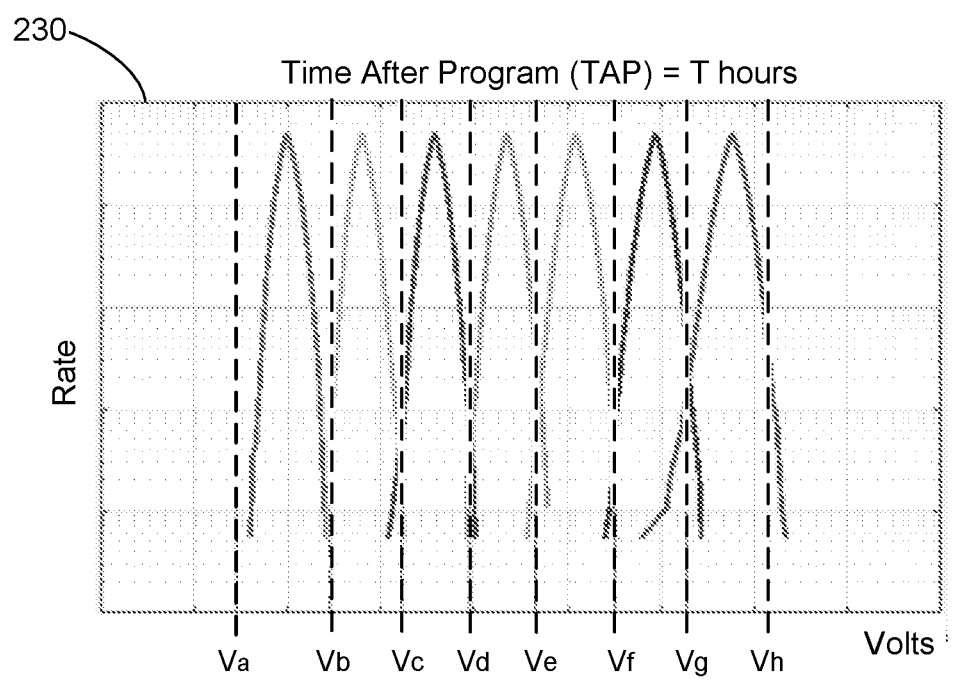
FIG. 2

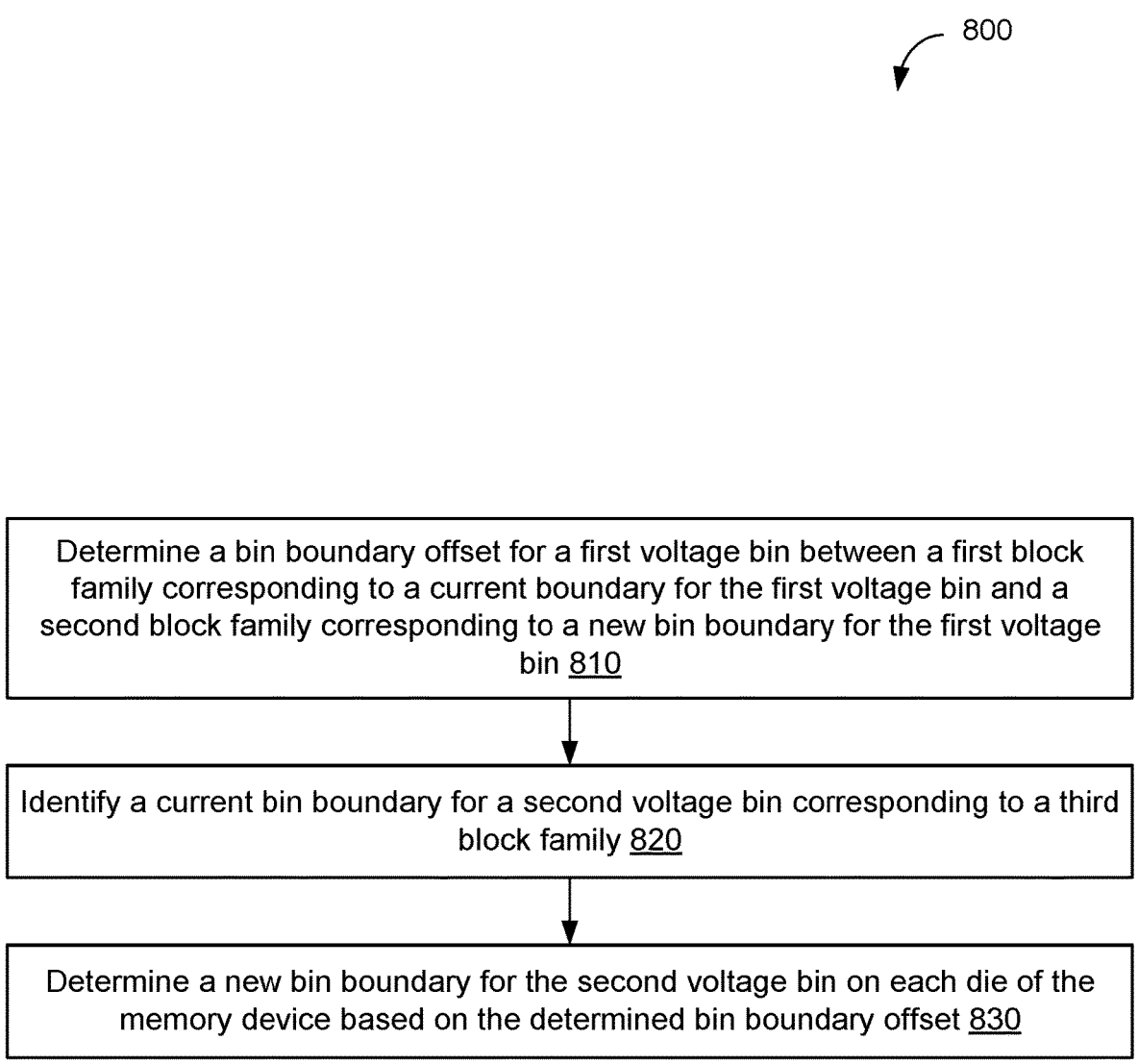

```
┌─────────────────────────────────────────────────────────────────────────┐
│ Determine a bin boundary offset for a first voltage bin between a first block │
│   family corresponding to a current boundary for the first voltage bin and a  │
│  second block family corresponding to a new bin boundary for the first voltage│
│                                   bin 810                                     │
└─────────────────────────────────────────────────────────────────────────┘
                                      │
                                      ▼
┌─────────────────────────────────────────────────────────────────────────┐
│  Identify a current bin boundary for a second voltage bin corresponding to a third │
│                              block family 820                                │
└─────────────────────────────────────────────────────────────────────────┘
                                      │
                                      ▼
┌─────────────────────────────────────────────────────────────────────────┐
│  Determine a new bin boundary for the second voltage bin on each die of the  │
│         memory device based on the determined bin boundary offset 830        │
└─────────────────────────────────────────────────────────────────────────┘
```

FIG. 8

| Block Family | Die 1 | Die 2 | Die 3 | ... | Die N-1 | Die N |
|---|---|---|---|---|---|---|
| 0 | 7 | 7 | 7 | 7 | 7 | 7 |
| 1 | 7 | 7 | 7 | 7 | 7 | 7 |
| 2 | 7 | 7 | 7 | 7 | 7 | 7 |
| 3 | 7 | 7 | 7 | 7 | 7 | 7 |
| 4 | 7 | 6 | 6 | 7 | 7 | 7 |
| ... | ... | ... | ... | ... | ... | ... |
| 20 | 6 | 6 | 6 | 6 | 6 | 6 |
| 21 | 5 | 6 | 6 | 6 | 5 | 6 |
| ... | ... | ... | ... | ... | ... | ... |
| 58 | 1 | 1 | 1 | 1 | 1 | 1 |
| 59 | 1 | 1 | 0 | 1 | 1 | 0 |
| 60 | 0 | 0 | 0 | 1 | 1 | 0 |
| ... | ... | ... | ... | ... | ... | ... |
| 64 | 0 | 0 | 0 | 0 | 0 | 0 |

FIG. 10A

| Block Family | Die 1 | Die 2 | Die 3 | ... | Die N-1 | Die N |
|---|---|---|---|---|---|---|
| 0 | 7 | 7 | 7 | 7 | 7 | 7 |
| 1 | 7 | 7 | 7 | 7 | 7 | 7 |
| 2 | 7 | 7 | 7 | 7 | 7 | 7 |
| 3 | 7 | 7 | 7 | 7 | 7 | 7 |
| 4 | 7 | 6 | 6 | 7 | 7 | 7 |
| ... | ... | ... | ... | ... | ... | ... |
| 58 | 1 | 1 | 1 | 1 | 1 | 1 |
| 59 | 1 | 1 | 1 | 1 | 1 | 0 |
| 60 | 0 | 1 | 1 | 1 | 1 | 0 |
| 61 | 0 | 1 | 0 | 1 | 1 | 0 |
| 62 | 0 | 0 | 0 | 0 | 0 | 0 |
| 63 | 0 | 0 | 0 | 0 | 0 | 0 |
| 64 | 0 | 0 | 0 | 0 | 0 | 0 |

FIG. 10B

| Block Family | Die 1 | Die 2 | Die 3 | ... | Die N-1 | Die N |
|---|---|---|---|---|---|---|
| 0 | 7 | 7 | 7 | 7 | 7 | 7 |
| 1 | 7 | 7 | 7 | 7 | 7 | 7 |
| 2 | 7 | 7 | 7 | 7 | 7 | 7 |
| 3 | 7 | 7 | 7 | 7 | 7 | 7 |
| 4 | 7 | 6 | 6 | 7 | 7 | 7 |
| ... | ... | ... | ... | ... | ... | ... |
| 58 | 1 | 1 | 1 | 1 | 1 | 1 |
| 59 | 1 | 1 | 1 | 1 | 1 | 1 |
| 60 | 1 | 1 | 1 | 1 | 1 | 1 |
| 61 | 1 | 1 | 1 | 1 | 1 | 1 |
| 62 | 0 | 1 | 0 | 1 | 1 | 0 |
| 63 | 0 | 0 | 0 | 0 | 0 | 0 |
| 64 | 0 | 0 | 0 | 0 | 0 | 0 |

FIG. 10C

| Block Family | Die 1 | Die 2 | Die 3 | ... | Die N-1 | Die N |
|---|---|---|---|---|---|---|
| 0 | 7 | 7 | 7 | 7 | 7 | 7 |
| 1 | 7 | 7 | 7 | 7 | 7 | 7 |
| 2 | 7 | 7 | 7 | 7 | 7 | 7 |
| 3 | 7 | 7 | 7 | 7 | 7 | 7 |
| 4 | 7 | 6 | 6 | 7 | 7 | 7 |
| ... | ... | ... | ... | ... | ... | ... |
| 58 | 1 | 1 | 1 | 1 | 1 | 1 |
| 59 | 1 | 1 | 1 | 1 | 1 | 1 |
| 60 | 1 | 1 | 1 | 1 | 1 | 1 |
| 61 | 1 | 1 | 1 | 1 | 1 | 1 |
| 62 | 1 | 1 | 1 | 1 | 1 | 0 |
| 63 | 0 | 1 | 0 | 1 | 1 | 0 |
| 64 | 0 | 0 | 0 | 0 | 0 | 0 |

FIG. 10D

| Block Family | Die 1 | Die 2 | Die N-1 | Die N |
|---|---|---|---|---|
| 0 | 7 | 7 | 7 | 7 |
| 1 | 7 | 7 | 7 | 7 |
| 2 | 7 | 7 | 7 | 7 |
| 3 | 7 | 7 | 7 | 7 |
| 4 | 7 | 6 | 7 | 7 |
| ... | ... | ... | ... | ... |
| 20 | 6 | 6 | 6 | 6 |
| 21 | 5 | 6 | 5 | 6 |
| 22 | 5 | 6 | 5 | 6 |
| 23 | 5 | 6 | 5 | 6 |
| 24 | 6 | 6 | 5 | 6 |
| 25 | 5 | 5 | 5 | 5 |
| 26 | 5 | 5 | 5 | 5 |
| ... | ... | ... | ... | ... |
| 59 | ... | ... | ... | ... |
| 60 | 1 | 1 | 1 | 1 |
| 61 | 1 | 1 | 1 | 1 |
| 62 | 0 | 1 | 1 | 0 |
| 63 | 0 | 0 | 0 | 0 |
| 64 | 0 | 0 | 0 | 0 |

FIG. 10E

| Block Family | Die 1 | Die 2 | Die N-1 | Die N |
|---|---|---|---|---|
| 0 | 7 | 7 | 7 | 7 |
| 1 | 7 | 7 | 7 | 7 |
| 2 | 7 | 7 | 7 | 7 |
| 3 | 7 | 7 | 7 | 7 |
| 4 | 7 | 6 | 7 | 7 |
| ... | ... | ... | ... | ... |
| 20 | 6 | 6 | 6 | 6 |
| 21 | 5 | 6 | 5 | 6 |
| 22 | 5 | 6 | 5 | 6 |
| 23 | 5 | 6 | 5 | 6 |
| 24 | 5 | 6 | 5 | 6 |
| 25 | 5 | 6 | 5 | 6 |
| 26 | 5 | 6 | 5 | 6 |
| ... | ... | ... | ... | ... |
| 59 | ... | ... | ... | ... |
| 60 | 1 | 1 | 1 | 1 |
| 61 | 1 | 1 | 1 | 1 |
| 62 | 0 | 1 | 1 | 0 |
| 63 | 0 | 0 | 0 | 0 |
| 64 | 0 | 0 | 0 | 0 |

FIG. 10F

VOLTAGE BIN BOUNDARY CALIBRATION AT MEMORY DEVICE POWER UP

RELATED APPLICATIONS

This application is a continuation of U.S. patent application Ser. No. 17/022,908, filed Sep. 16, 2020, the entire contents of which is hereby incorporated by reference herein.

TECHNICAL FIELD

Embodiments of the disclosure relate generally to memory sub-systems, and more specifically, relate to voltage bin boundary calibration at memory device power up.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 schematically illustrates the temporal voltage shift caused by the slow charge loss exhibited by triple-level memory cells, in accordance with some embodiments of the present disclosure.

FIG. 8 is a flow diagram of another example method to update a bin boundary for a voltage bin after memory device power on, in accordance with some embodiments of the present disclosure.

FIGS. 10A-F schematically illustrate updating a bin boundary for a voltage bin after a memory device is powered on, in accordance with some embodiments of the present disclosure.

DETAILED DESCRIPTION

Figure 1:
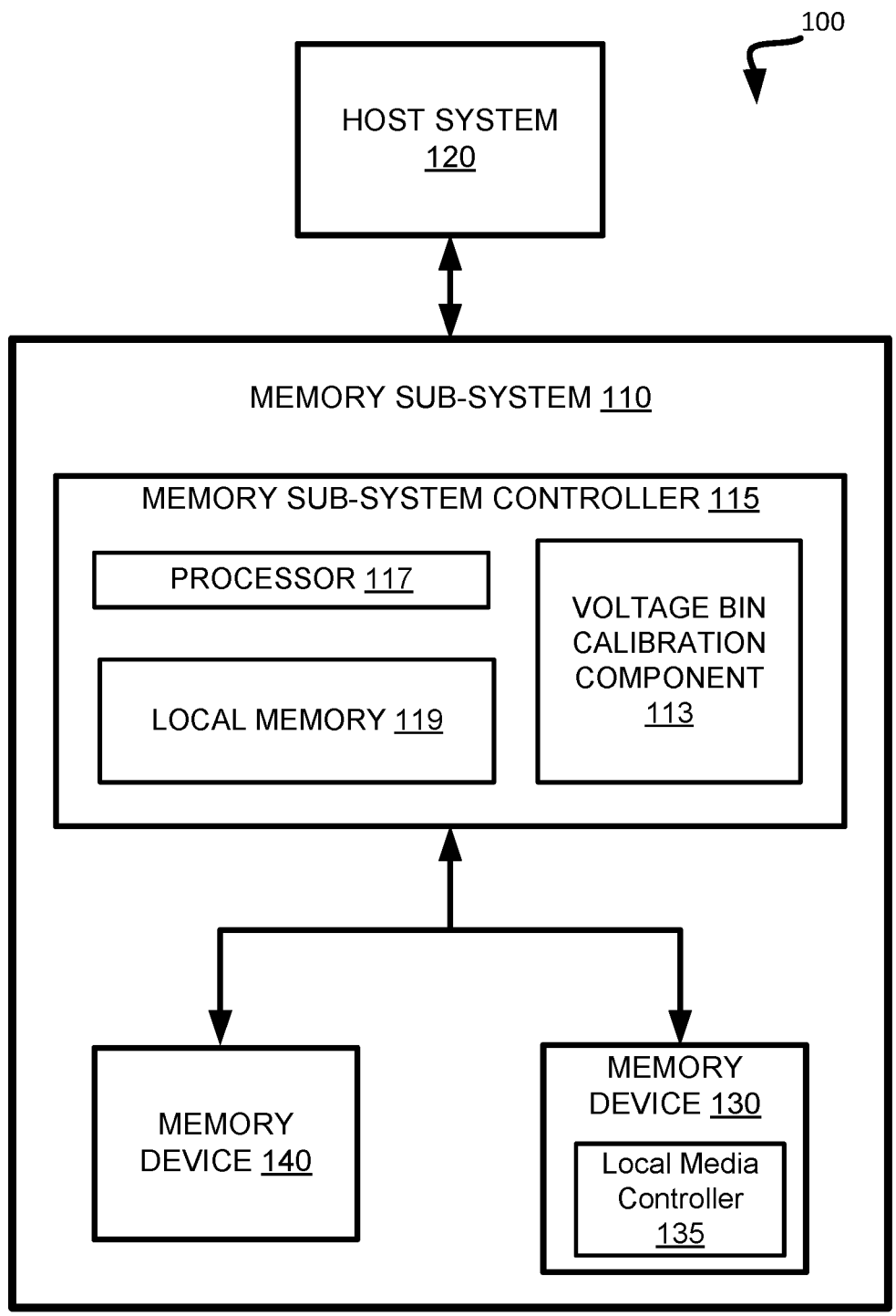
FIG. 1 illustrates an example computing environment that includes a memory sub-system, in accordance with some embodiments of the present disclosure.

Aspects of the present disclosure are directed to voltage bin boundary calibration at memory device power up. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. "Block" herein shall refer to a set of contiguous or non-contiguous memory pages. An example of a "block" is an "erasable block," which is the minimal erasable unit of memory, while "page" is a minimal writable unit of memory. Each page includes a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, a block family experiences a specified temperature range using an aggregate temperature, which can change or be defined according to a temperature metric in different embodiments. For example, in response to a timer reaching a soft closure value, a controller of the memory sub-system can perform a soft closure of the block family. Or, alternatively, in response to an aggregate temperature (based on temperature values received from temperature sensor(s) of the memory device) being greater than or equal to a specified threshold temperature, the controller can likewise perform a soft closure of the block family.

After performing the soft closure, the memory sub-system can continue to program to a partially written block until the timer reaches hard closure value or the block family satisfies a hard closure criteria. In this way, the memory sub-system has an extension time before the hard closure during which to complete writing to the partially written block, decide whether to partition the block, or to write dummy data to the unwritten portion of the block after hard closure. After hard closure of one block family, further programming to dice of the memory device is to a newly opened block family. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die of every block family with one of the predefined threshold voltage offset bins (referred to as voltage bins or voltage), which is in turn associated with the voltage offset to be applied for read operations. The associations of pages or blocks with block families and block families and dies with voltage bins can be stored in respective metadata tables maintained by the memory sub-system controller.

The threshold voltage for each memory cell can continue to shift even when a memory device is powered off. Depending on the amount of time the memory device is powered off, and the temperature of the memory device while powered off, the temporal voltage shift of each block family can be significant. As a result, the bin allocation to block families stored in respective metadata tables prior to the memory device being powered off can be inaccurate when the memory device is powered back on. In some instances, a memory sub-system does not have a timer or a clock that tracks the amount of time a memory device is powered off. When the memory device is powered back on, the memory controller is unaware of the amount of time the device was powered off. The memory sub-system is also unaware of the temperature conditions surrounding each of its memory devices during the power off state. Therefore, the memory sub-system controller is unaware of the temporal voltage shift that has occurred for each block family and thus cannot adjust the voltage bin allocation to block families without calibration of at least some pages or blocks.

In one example, the memory sub-system controller can perform a full scan of the memory device to calibrate the threshold voltage offsets to be applied to each block family. The memory sub-system controller performs a set of read operations for a block family using voltage offsets associated with each voltage bin of the memory device. The memory sub-system controller identifies a read operation performed that resulted in the optimal data state metric (e.g., the lowest bit error rate, which is the number of received bits that have been altered due to an error at the memory sub-system) and determines the voltage offset that has been applied for the identified read operation. The memory sub-system controller updates the respective metadata table to associate the block family including the block with the voltage bin corresponding to the determined voltage offset. This series of operations can be performed for each block of each block family on each die of the memory device. As a memory device can include hundreds or sometimes thousands of pages or blocks, performing a full scan of the memory device can take a significant amount of time and utilize a significant amount of system resources.

Aspects of the present disclosure address the above and other deficiencies by performing selective, rather than full, calibration for a limited number of pages or blocks of the memory device in order to identify new bin boundaries. Since the threshold voltage shifts monotonically (e.g., in an approximately logarithmic fashion) with respect to the time elapsed since the cell programming event, any given die across two temporally adjacent block families would be assigned to either the same voltage bin or two adjacent voltage bins, thus making the voltage bin number for any given die changing monotonically across all block families. Thus, the memory sub-system controller can track the movement of the bin boundary (i.e., the boundary between two adjacent block families such that at least one die would be assigned to different voltage bins for the two block families) by determining the bin boundary offset for a chosen die between the current bin boundary (e.g., the bin boundary before the power off event) and the new bin boundary (e.g., the bin boundary that should be established based on the current data state metrics after the power off event), and apply the offset to the calculate new bin boundaries for all dies of the memory device. The memory sub-system can determine the current bin boundary for a chosen die based on a set of bin pointers indicating voltage bins associated with a block family on each die prior to the memory device being powered off. For example, when the memory device is powered on, the memory sub-system controller can reference a metadata table configured to store an indication of a set of voltage bins associated with respective dies of the block family. The memory sub-system controller can identify the current bin boundary for a particular voltage bin by identifying a set of voltage bins for the oldest (i.e., the least recently created) block family at the memory device that includes a bin pointer corresponding to the voltage bin.

The memory sub-system controller performs a calibration scan to update bin pointers for the block families on the chosen die. The memory sub-system controller performs the calibration scan by performing calibration operations for the oldest block family associated with the current bin boundary and for block families on the chosen die that are temporally adjacent to the oldest block family. For example, the memory sub-system controller can perform the calibration operation for a second oldest block family previously associated with the voltage bin (i.e., a block family that is temporally adjacent to the oldest block family). The memory sub-system controller performs the calibration scan for each block family that is younger (i.e., created more recently) than the oldest block family until the memory sub-system controller determines that an updated bin pointer for a block family corresponds to the particular voltage bin. The memory sub-system controller associates the new bin boundary for the voltage bin with the corresponding block family on the chosen die.

The memory sub-system controller determines a bin boundary offset between the new bin boundary and the previous bin boundary. In some embodiments, the memory sub-system controller can determine the bin boundary offset based on a temporal difference between the block family corresponding to the previous bin boundary and the block family corresponding to the new bin boundary. The temporal difference between two block families corresponds to the amount of time between the first block family creation and the second block family creation. The memory sub-system controller can apply the bin boundary offset to other respective dies of the memory device to identify new bin boundaries for each voltage bin. The procedure can be repeated for all bin boundaries (e.g., if the memory sub-system supports eight voltage offset bins, there will be seven bin boundaries).

Advantages of the present disclosure include, but are not limited to, decreasing an amount of time to identify a bin boundary for each voltage bin. The memory sub-system controller can initiate the calibration scan at a block of the oldest block family at a chosen die and perform the calibration test for pages or blocks of younger block families until a new bin boundary is identified. The difference between the current bin boundary and the new bin boundary at a chosen die can correspond to an estimation of temporal voltage shift that occurred while the memory device was powered off. The memory sub-system controller can use the estimation to update the bin boundaries for each die of the memory device. Therefore, a full scan of each block on the memory device is not performed. As the memory sub-system controller updates the bin boundaries based on the estimation of temporal voltage shift rather than by performing a full scan of each block on the memory device, an amount of time needed to identify each bin boundary for each threshold voltage offset bin is reduced, which reduces the overall amount of initialization time for a memory device. Further, by performing the calibration tests on particular pages or blocks of a chosen die rather than each page or block of the memory device, a significant amount of memory sub-system resources are made available for other processes, resulting in a decrease in overall system latency and an increase in overall system efficiency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130, 140 (e.g., NAND type flash memory devices), such that the payload is distributed through a subset of dies, while the remaining one or more dies are used to store the error correction information (e.g., party bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a voltage bin calibration component 113 that can update a bin boundary for threshold voltage offset bins (referred to herein as voltage bins) including one or more block families after a memory device is powered up. In some embodiments, the memory sub-system controller 115 includes at least a portion of the voltage bin calibration component 113. For example, the memory sub-system controller 115 can include a processor 117 (processing device) configured to execute instructions stored in local memory 119 for performing the operations described herein. In some embodiments, the voltage bin calibration component 113 is part of the host system 110, an application, or an operating system. Further details regarding block families and voltage bin calibration component 113 are described below.

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

As noted above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with 2n different threshold voltage levels is capable of storing n bits of information.

In FIG. 2, each graph 220A-220N shows a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

As seen from comparing example charts 210 and 230, which reflect the time periods immediately after programming and a respective number of hours after programming, respectively, the voltage distributions change in time due to the slow charge loss, which results in drifting values of the threshold voltage levels, which are shown by dashed vertical lines. In various embodiments of the present disclosure, the temporal voltage shift is selectively tracked for programmed pages or blocks grouped by block families, and appropriate voltage offsets, which are based on page or block affiliation with a certain block family, are applied to the base read levels in order to perform read operations.

Figure 3:
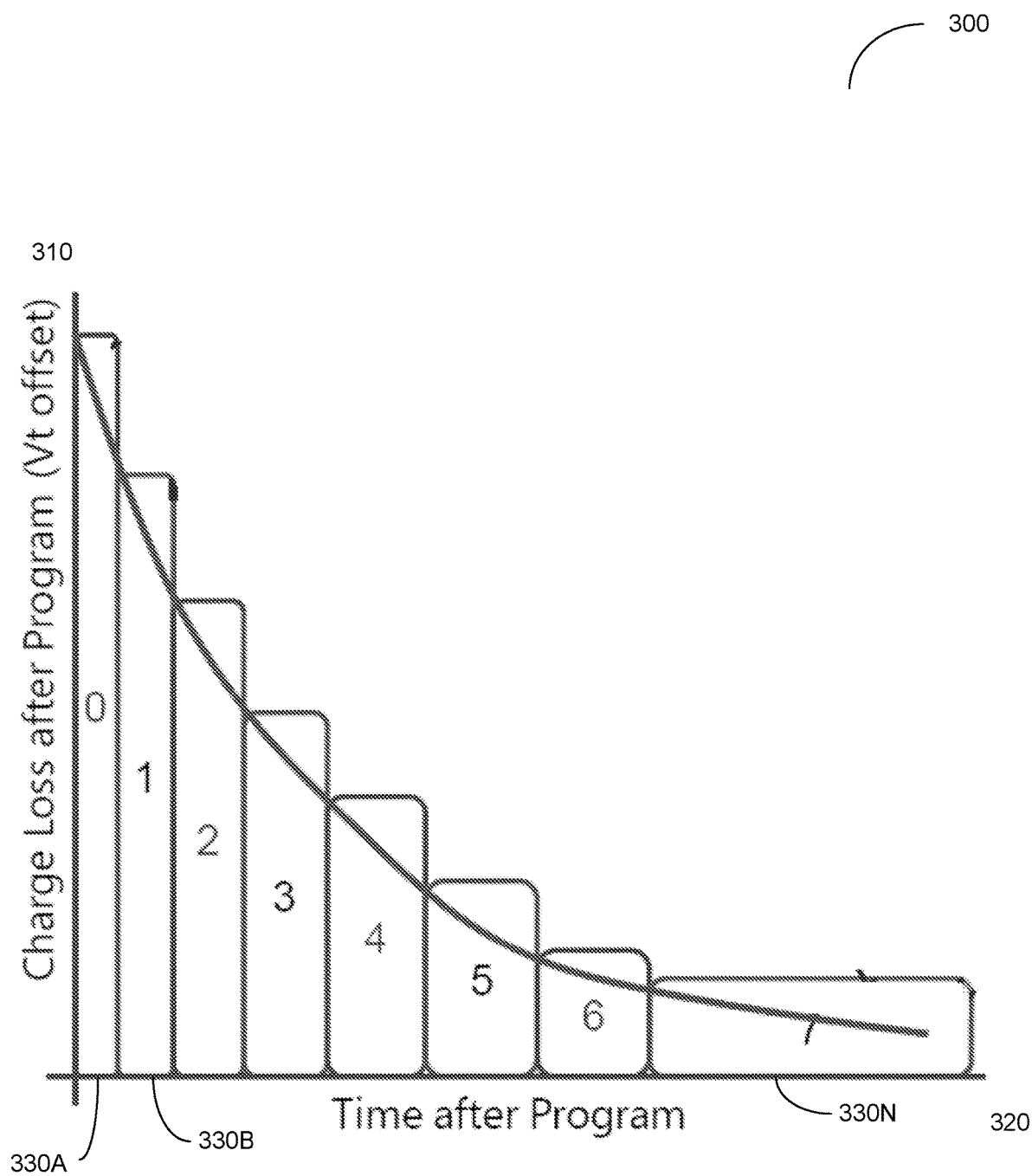
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph illustrating the dependency of the threshold voltage offset on the time after program (i.e., the period of time elapsed since the page had been programmed, in accordance with some embodiments of the present disclosure. As schematically illustrated by FIG. 3, block families of the memory device are grouped into bins 330A-330N, such that each block family includes one or more pages or blocks that have been programmed within a specified time window and a specified temperature window. As noted herein above, since the time elapsed after programming and temperature are the main factors affecting the temporal voltage shift, all pages, blocks, and/or partitions within a single block family 310 are presumed to exhibit similar distributions of threshold voltages in memory cells, and thus would require the same voltage changes for read operations.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with a particular bin (e.g., bin 0, bin 1, etc.). Then, the memory sub-system controller can periodically perform a calibration process in order to associate each die of every block family with one of the predefines voltage bins (bins 0-7 in the illustrative example of FIG. 3), which is in turn associated with the voltage offset to be applied for read operations. The associations of blocks with block families and block families and dies with voltage bins can be stored in respective metadata tables maintained by the memory sub-system controller, such as metadata table 900 described with respect to FIGS. 9A-F below.

Figure 4:
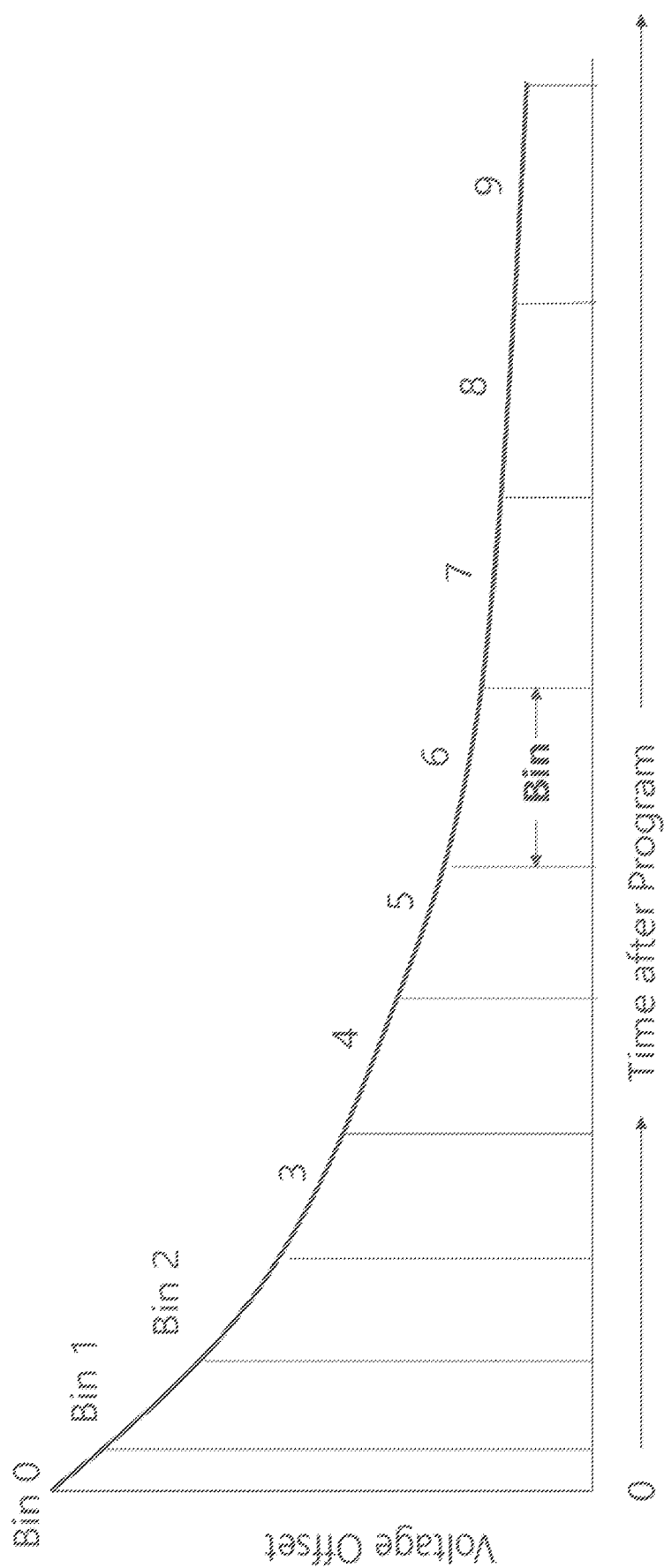
FIG. 4 schematically illustrates a set of predefined threshold voltage offset bins, in accordance with embodiments of the present disclosure.

FIG. 4 schematically illustrates a set of predefined threshold voltage offset bins (referred to as voltage bins herein), in accordance with embodiments of the present disclosure. As schematically illustrated by FIG. 4, the threshold voltage offset graph can be subdivided into multiple voltage bins, such that each voltage bin corresponds to a predetermined range of threshold voltage offsets. While the illustrative example of FIG. 4 defines ten voltage bins, in other implementations, various other numbers of voltage bins can be employed (e.g., 64 bins).

The memory sub-system controller can associate each die of every block family with a voltage bin, based on a periodically performed calibration process. The calibration process defines a set of threshold voltage offsets to be applied to the base voltage read level in order to perform read operations. The calibration process involves performing, with respect to a specified number of randomly selected pages or blocks within the block family that is being calibrated, read operations utilizing different threshold voltage offsets, and choosing the threshold voltage offset that minimizes the error rate (e.g., a bit error rate) of the read operation. Further details regarding the calibration process are provided with respect to FIG. 9.

Figure 5:
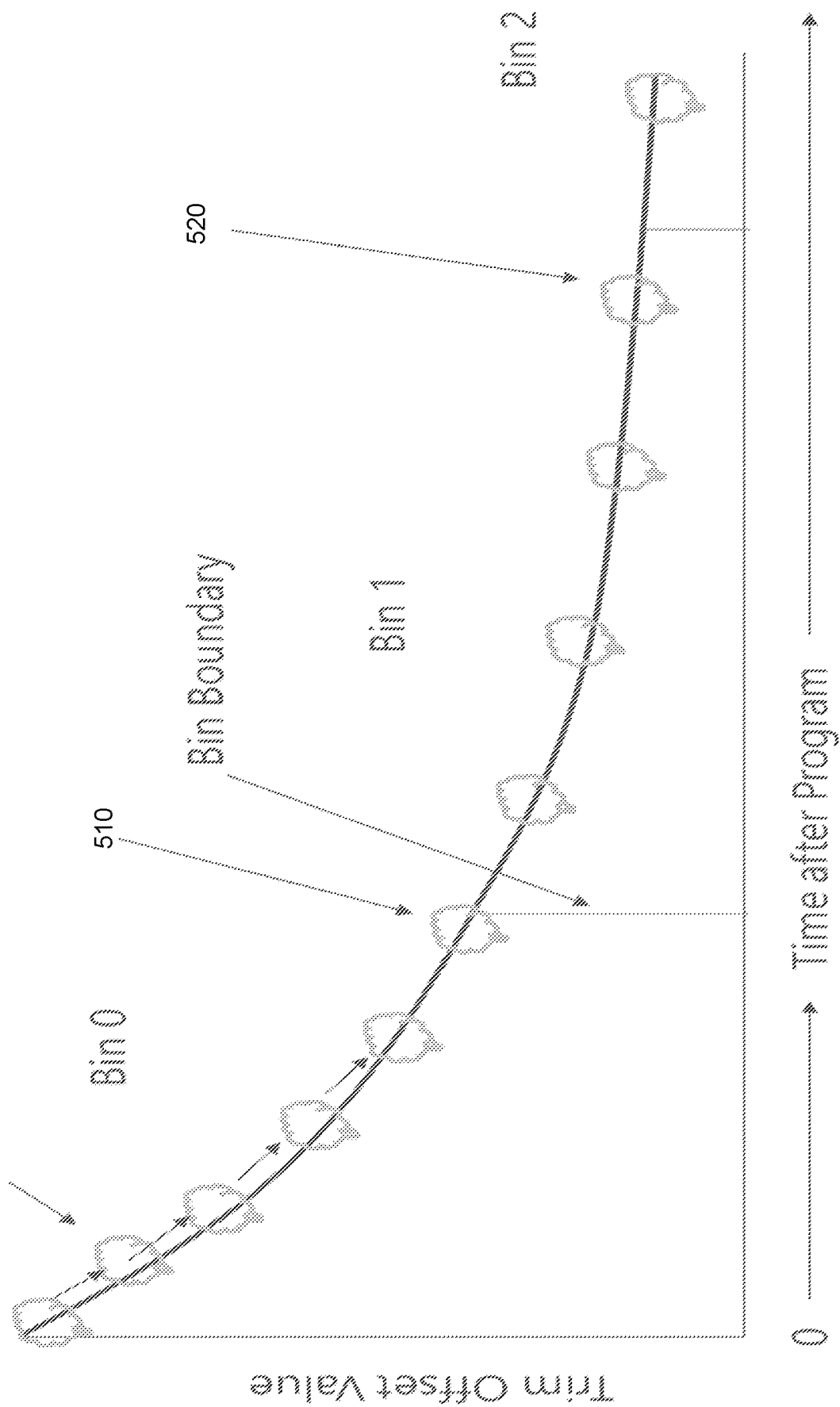
FIG. 5 schematically illustrates selecting block families for calibration, in accordance with embodiments of the present disclosure.

FIG. 5 schematically illustrates selecting block families for calibration, in accordance with embodiments of the present disclosure. Due to slow charge loss, the oldest block families in a voltage bin will migrate to the next voltage bin before any other block families of the current bin. As such, the memory sub-system controller can limit calibration operations to the oldest block families in a bin (e.g., block family 510 in bin 0 and block family 520 in bin 1). In some embodiments, the memory sub-system controller can identify the oldest block family in a voltage bin based on a bin boundary for the bin. A bin boundary can represent a boundary between two adjacent block families that are each associated with a different bin. As described previously, the memory sub-system controller maintains respective metadata table, which is configured to store associates of block families and dies with voltage offset bins.

Figure 6:
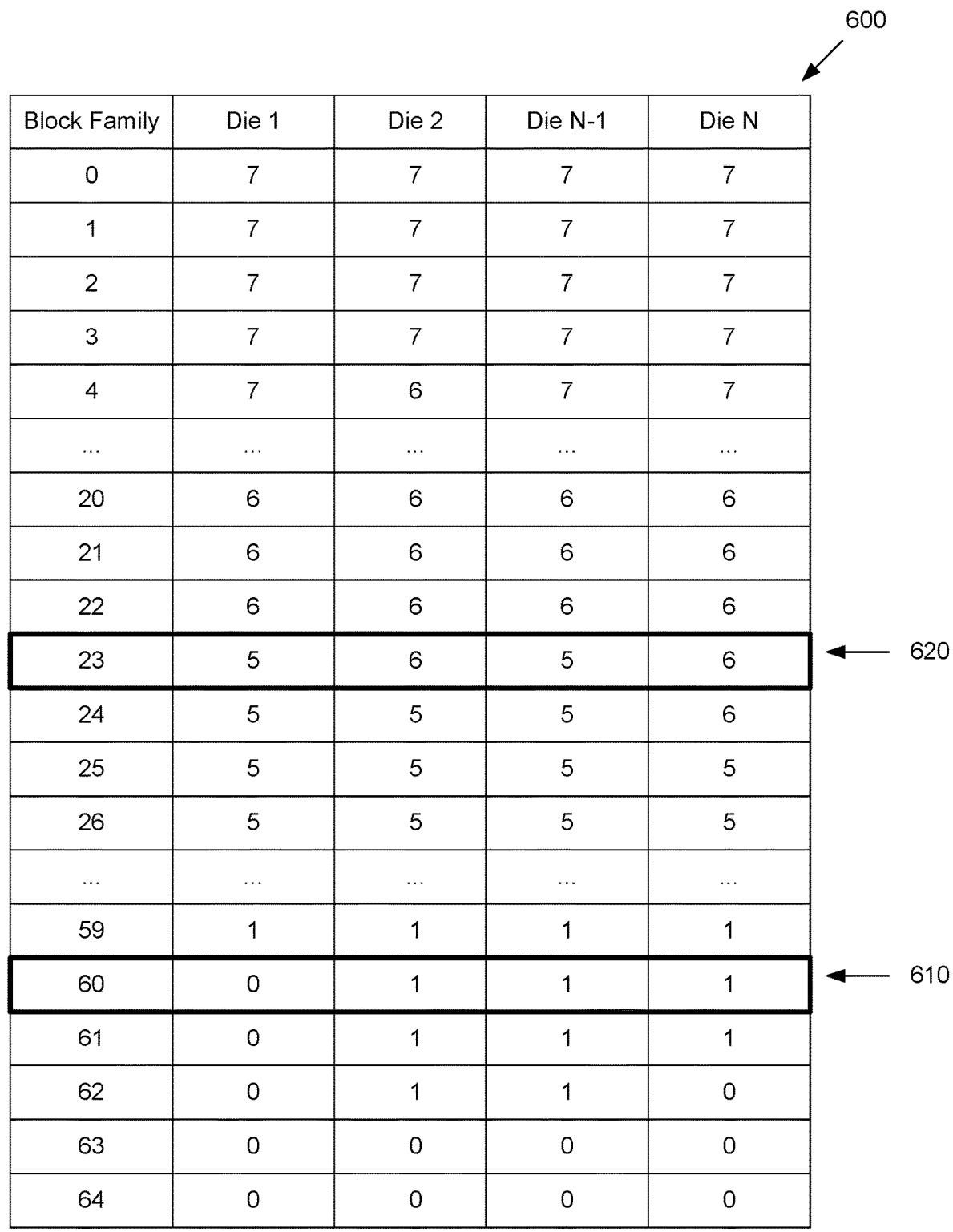
FIG. 6 illustrates a block family table maintained by a memory sub-system controller, in accordance with embodiments of the present disclosure.

FIG. 6 illustrates an example block family table 600 maintained by the memory sub-system controller. Block family table 600 can be stored in memory of the memory sub-system (e.g., at memory device 130, 140, local memory 119, etc.) and can be referenced by the memory sub-system controller to determine the voltage bin associated with a particular block family. Block family table 600 is indexed by the block family number, such that each record of the block family table 600 specifies, for the block family referenced by the index of record, a set of voltage bins associated with respective dies of the block family. In other words, each record of the block family table 600 includes a vector, each element of which specifies the voltage bin associated with the die referenced by the index of the vector element (referred to as a bin pointer). The memory sub-system controller determines the voltage bin associated with a particular block family based on the bin pointer having the lowest value included in the vector for the block family. In an illustrative example, the lowest bin pointer value of the vector for block family 60 is associated with voltage bin 0 (i.e., for die 1). Therefore, the memory sub-system controller associates block family 60 with voltage bin 0. In response to receiving a request to read data included in block family 60, the memory sub-system controller uses the threshold voltage associated with voltage bin 0, regardless of whether the requested data is stored at die 1 or die 2 through N.

As described previously, a bin boundary can represent a boundary between two adjacent block families that are each associated with a different voltage bin. Therefore, the memory sub-system controller can identify a bin boundary for a voltage bin based on the bin pointers of the vector included in each record of the block family table 600. The memory sub-system controller can identify a voltage bin boundary for a particular voltage bin by identifying the oldest block family (i.e., the block family least recently created) associated with a vector including bin pointers for one or more die that correspond to the particular voltage bin. As illustrated in FIG. 6, the vectors for block families 60-64 include a bin pointer associated with voltage bin 0. The memory sub-system controller can associate block family 60 with a bin boundary 610 for voltage bin 0, as block family 60 is the oldest block family of block family table 600 where the bin pointer for die 1 corresponds to voltage bin 0. Also illustrated in FIG. 6, the vectors for block families 23-26 include a bin pointer associated with voltage bin 5. The memory sub-system controller can associate block family 23 with a bin boundary 620 for voltage bin 5, as block family 23 is the oldest block family of block family table 600 where the bin pointers for die 1 and die n−1 corresponds to voltage bin 5.

The memory sub-system controller can identify the oldest block family in a voltage bin to calibrate based on a bin boundary for the voltage bin. In response to receiving an instruction to perform a calibration for a particular voltage bin, such as voltage bin 0, the memory sub-system controller can identify the bin boundary for voltage bin 0, in accordance with previously described embodiments. As discussed previously, block family 60 is associated with the bin boundary for voltage bin 0, therefore, the memory sub-system controller can perform the calibration operation for block family 60. In some instances, a result of the calibration operation can cause one or more bin pointer values of the vector of the block family to change. For example, the calibration operation performed for block family 60 can cause the bin pointer value for die 1 to change from bin 0 to bin 1. As a result, block family 60 is no longer the oldest block family of the block family table 600 where a bin pointer for the block family on die 1 corresponds to voltage bin 0. The memory sub-system controller updates the bin boundary for voltage bin 0 to correspond to block family 61 and block family 60 is now associated with voltage bin 1.

Referring back to FIG. 1, voltage bin calibration component 113 can be configured to update bin boundaries for voltage bins after a memory device is powered up. When a memory device 130, 140 is powered off, the threshold voltage for each memory cell of the memory device 130, 140 continues to shift, which can be significant depending on the amount of time the memory device is powered off and the temperature of the memory device while powered off. The memory sub-system controller 115 is unaware of the temporal voltage shift that has occurred for each block family, and therefore is unaware of the voltage bin allocation to the block families.

Voltage bin calibration component 113 can calibrate a limited number of blocks of the memory device in order to identify new bin boundaries when the memory device is powered up. In response to the memory device 130, 140 being powered up, voltage bin calibration component 113 can identify the current bin boundary for a particular voltage bin by referencing the block family table 600 that was stored (e.g., at memory device 130, 140 or in local memory 119) prior to the memory device being powered off. Voltage bin calibration component 113 can select a target die to calibrate by identifying a die illustrating the slowest temporal voltage shift. Voltage bin calibration component 113 can initiate a calibration scan for the voltage bin, by performing a calibration operation for the oldest block family on the target die (i.e., identified by the current bin boundary). Voltage bin calibration component 113 can continue the calibration scan by performing a subsequent calibration operation to update bin pointers for each block family on the target die that is younger (i.e., created more recently) than the oldest block family. In response to determining an updated bin pointer for a block family on the target die corresponds to the particular voltage bin, voltage bin calibration component 113 can associate the block family with the new bin boundary for the voltage bin.

Voltage bin calibration component 113 can determine a bin boundary offset for the voltage bin based on a temporal difference between the block family associated with the previous bin boundary and the block family associated with the new bin boundary. Voltage bin calibration component 113 can update a new bin boundary for the voltage bin on each die of the memory device using the determined bin boundary offset. In some embodiments, voltage bin calibration component 113 can determine a bin boundary offset for each voltage bin. In other of similar embodiments, voltage bin calibration component 113 can update the bin boundary for each voltage bin using the bin boundary offset identified for a single voltage bin.

Figure 7:
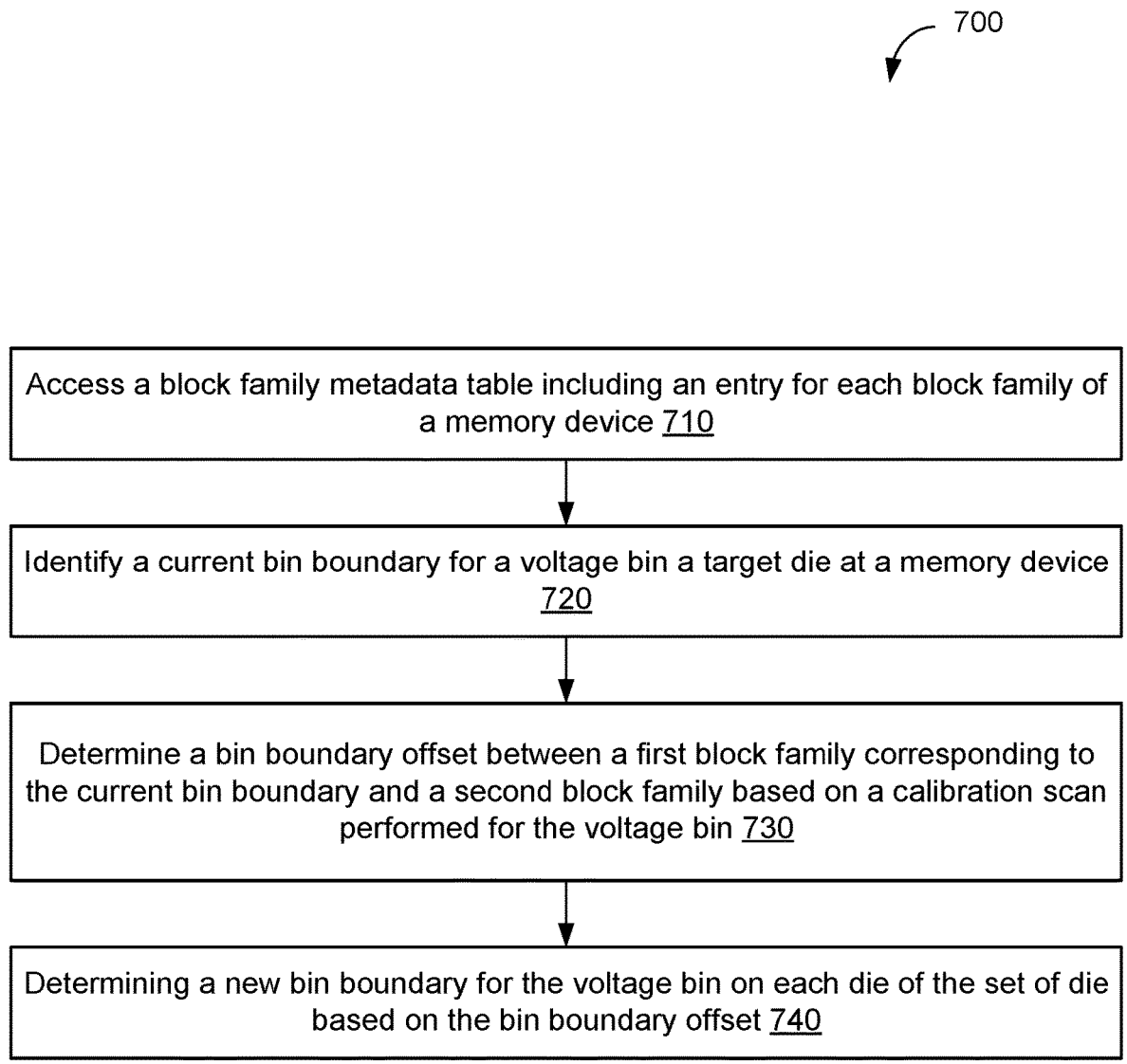
FIG. 7 is a flow diagram of an example method to update a bin boundary for a voltage bin after a memory device is powered on, in accordance with some embodiments of the present disclosure.

FIG. 7 is a flow diagram of an example method 700 to update a bin boundary for a voltage bin after a memory device is powered on, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the voltage bin calibration component 113 of FIG. 1. In other or similar embodiments, one or more operations of method 700 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing device accesses a block family metadata table including an entry for each block family of a memory device. At operation 720, processing device identifies a current bin boundary for a first voltage bin on a target die at a memory device. The current bin boundary corresponds to a first block family associated with the first voltage bin. The processing device can identify the current bin boundary for the first voltage bin using a block family table maintained by the memory sub-system controller before the memory device was powered off, in accordance with previously described embodiments.

FIG. 10A illustrates a block family table 1000 maintained by a memory sub-system controller. In some embodiments, the block family table 1000 is maintained by voltage bin calibration component 113. In other or similar embodiments, the block family table 1000 is maintained by another component of memory sub-system controller 115, such as a block family manager. Voltage bin calibration component 113 can identify a current bin boundary for a first voltage bin, such as bin 0, based on bin pointers in vectors for each block family. As illustrated in FIG. 10A, voltage bin calibration component 113 can identify current bin boundary 1010 associated with block family 59, as block family 59 is the oldest block family of the block family table 1000 where bin pointers for die 3 and die n correspond to voltage bin 0. Voltage bin calibration component 113 can also identify the current bin boundary 1020 for voltage bin 5 associated with block family 21 and the current bin boundary 1030 for voltage bin 6 associated with block family 4, in accordance with previously described embodiments.

In some embodiments, voltage bin calibration component 113 can select a target die to perform the calibration scan by identifying a particular die on the memory device illustrating the slowest temporal voltage shift. As illustrated in FIG. 10A, the bin pointers for die 3 and die n of the vector for block family 59 are associated with voltage bin 0, while the bin pointers for die 1, 2, and n-1 are associated with voltage bin 1. As the bin pointers for die 3 and n are associated with a lower numbered voltage bin than the bin pointers for die 1, 2, and n-1, voltage bin calibration component 113 can determine that the temporal shift of die 3 and die n is a minimal temporal voltage shift among the set of dies (i.e., is slower than the temporal shift of die 1, 2, and n-1). Therefore, voltage bin calibration component 113 can select die 3 or die n as target die to perform the calibration scan. It should be noted that although embodiments of the present disclosure are directed to voltage bin calibration component 113 selecting die 3 as the target die, voltage bin boundary component can select any die, including die N, that satisfies the above descried conditions.

Referring back to FIG. 7, At operation 730, the processing device determines a bin boundary offset between a first block family corresponding to the current bin boundary and a second block family corresponding to a new bin boundary for the first target die. In some embodiments, the processing device can determine the first temporal difference offset based on a calibration scan performed for the voltage bin. During the calibration scan, a series of calibration operations are performed for block families associated with the voltage bin. Further details regarding the calibration operations are provided with respect to FIG. 9 below.

FIG. 10B illustrates the results of a calibration scan performed for voltage bin 0, in accordance with embodiments described herein. As described previously, voltage bin calibration component 113 can initiate the calibration scan by performing a calibration operation for the oldest block family on the target die, which, in this example, is block family 59 on target die 3. As illustrated in FIG. 10B voltage bin calibration component 113 can update the bin pointer for target 3 to be associated with voltage bin 1, as a result of the calibration operation. Voltage bin calibration component 113 can continue the calibration scan by performing a subsequent calibration operation to update bin pointers for each block family younger than the oldest block family (i.e., block families 60, 61, etc.). Voltage bin calibration component 113 can continue the calibration scan until an updated bin pointer for a block family on the target die corresponds to the particular voltage bin. As illustrated in FIG. 10B, the updated pointer for block family 62 on die 3 corresponds to voltage bin 0. As such, voltage bin calibration component 113 can associate the new bin boundary for bin 0 on die 3 with block family 62. Voltage bin calibration component 113 completes the calibration scan in response to identifying the new bin boundary for the voltage bin.

In response to completing the calibration scan for the voltage bin, voltage bin calibration component 113 can determine a bin boundary offset based on a temporal distance between the block family associated with the previous bin boundary and the block family associated with the new bin boundary. As described previously, a temporal distance between block families corresponds to an amount of time between a first block family creation and a second block family creation. For purposes of the present disclosure, the temporal distance between two block families can be defined based on a difference between block family indices of the block family table 1000. For example, the temporal distance between the block family 59 (i.e., the block family associated with the previous bin boundary) and block family 62 (i.e., the block family associated with the new bin boundary) can correspond to 4 block families (i.e., block families 59-62). As such, voltage bin calibration component 113 can determine the bin boundary offset for voltage bin 0 as 4, based on the determined temporal distance between block family 59 and block family 62.

Referring back to FIG. 7, at operation 740, the processing device determines a new bin boundary for the voltage bin on each die of the set of dies based on the bin boundary offset. As illustrated in FIG. 10C, voltage bin calibration component 113 has updated the bin boundary for voltage bin 0 on each die to correspond with block family 62, based on the bin boundary offset. As a result, block families older than block family 62 are now associated with an voltage bin 1 and block families younger than block family 62 remain associated with voltage bin 0. In response to updating the bin boundary for voltage bin 0, voltage bin calibration component 113 can update the bin pointers of each block family older than block family 62 to correspond to voltage bin 1, as illustrated for block families 59-61 in FIG. 10C. In some embodiments, voltage bin calibration component 113 can update the bin pointers for block families that are younger than block family 62 to correspond to the bin pointers associated with block families adjacent to the previous bin boundary. For example, as illustrated in FIG. 10D, voltage bin calibration component 113 can update the bin pointers for block families 62-64 (i.e., block families adjacent to the new bin boundary for voltage bin 0) to correspond to the previous bin pointers for block families 59-61 (as seen in FIG. 10A). By updating the bin pointers for the block families adjacent to the new bin boundary to correspond to the bin pointers for block families adjacent to the previous bin boundary, voltage bin calibration component 113 can continue to monitor the speed of temporal shift for each die of the memory device, in accordance with previously described embodiments.

In some embodiments, voltage bin calibration component 113 can update a bin boundary for each voltage bin of a memory device by performing the operations described with respect to method 700. For example, voltage bin calibration component 113 can identify a current bin boundary for voltage bin 5 on a target die, determine a distinct bin boundary offset or voltage bin 5, and update the bin boundary for voltage bin 5 on all die based on the determined bin boundary offset. In accordance with embodiments described with respect to FIG. 8 below, voltage bin calibration component 113 can determine a bin boundary offset for a single voltage bin (i.e. voltage bin 0) and determine a new bin boundary for each voltage bin of the memory device based on the determined bin boundary offset.

FIG. 8 is a flow diagram of another example method 800 to update a bin boundary for a voltage bin after memory device power on, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the voltage bin calibration component 113 of FIG. 1. In other or similar embodiments, one or more operations of method 800 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing device determines a bin boundary offset for a first voltage bin based on a temporal difference between a first block family corresponding to a current boundary for the first voltage bin and a second block family corresponding to a new bin boundary for the first voltage bin. The processing device can determine the bin boundary offset in accordance with previously described embodiments. For example, voltage bin calibration component 113 can determine the bin boundary offset for voltage bin 0 corresponds to a temporal distance of 4 block families.

At operation 820, the processing device identifies a current bin boundary for a second voltage bin corresponding to a third block family. As illustrated in FIG. 10E, voltage bin calibration component 113 can identify a current bin boundary for voltage bin 5, in accordance with previously described embodiments. The current bin boundary for voltage bin 5 can correspond with block family 21.

At operation 830, the processing device selects a new bin boundary for the second voltage bin on each die of the memory device based on the determined bin boundary offset. As illustrated in FIG. 10E, voltage bin calibration component 113 can identify block family 24 as the new bin boundary for voltage bin 5 based on the determined bin boundary offset for voltage bin 0. A temporal distance between block family 21 and block family 24 (i.e., 4 block families) corresponds to the temporal distance between block family 59 and block family 62, in accordance with the bin boundary offset.

As illustrated in FIG. 10F, voltage bin calibration component 113 can update the bin pointers for each block family older than block 24 in response to selecting the new bin boundary for voltage bin 5, in accordance with previously described embodiments. In other or similar embodiments, voltage bin calibration component 113 can update the bin pointers for each block family younger than block 24 to correspond to the bin pointers associated with the block families adjacent to the previous bin boundary, as previously described. For example, voltage bin calibration component 113 can update the bin pointers for block families 24-26 to correspond to the previous bin pointers associated with block families 21-23.

Figure 9:
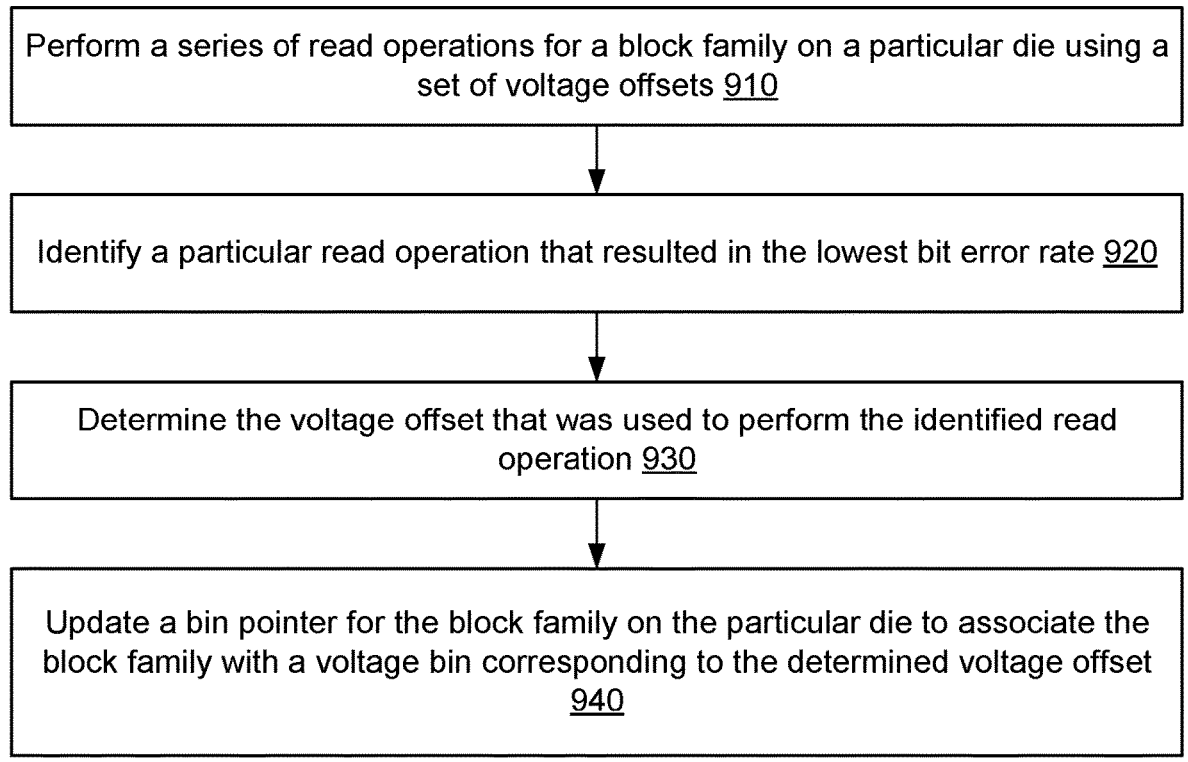
FIG. 9 is a flow diagram of an example method to perform a calibration operation for block families on a die, in accordance with some embodiments of the present disclosure.

FIG. 9 is a flow diagram of an example method 900 to perform a calibration operation for a block family on a target die, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the voltage bin calibration component 113 of FIG. 1. In other or similar embodiments, one or more operations of method 900 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing device performs a series of read operations for a block family on a particular die using a set of voltage offsets. Each of the set of voltage offsets can correspond to a voltage offset associated with a voltage bin of the memory device. For example, a memory device can include 8 voltage bins (i.e. voltage bins 0-7) where each voltage bin corresponds to a distinct voltage offset. Therefore, the set of voltage offsets can correspond to voltage offsets associated with voltage bins 0-7. In some embodiments, the set of voltage offsets can correspond to voltage offsets associated with particular voltage bins of the memory device. For example, the processing device can perform the calibration operation for a particular block family associated with voltage bin 2. The processing device can perform the series of read operations for the particular block family using a set of voltage offsets corresponding with voltage offsets for voltage bins including block families that are older than the particular block family (i.e., block families associated with voltage bins 3-7), as well as the voltage offset for voltage bin 2.

The processing device can determine a bit error rate for each read operation performed for the block family. As described previously a bit error rate can refer to the number of received bits that have been altered due to an error at the memory sub-system. In some embodiments, a bit error rate can correspond to the voltage offset applied to the memory device during a read operation. At operation 920, the processing device identifies a particular read operation of the series of read operations performed for the block family that resulted in the lowest bit error rate.

At operation 930, the processing device determines the voltage offset that was used to perform the identified read operation. For example, the processing device can determine that a third read operation in the series of read operations resulted in the lowest bit rate. The processing device can determine that a voltage offset associated with voltage bin 4 was used to perform the third read operation.

At operation 940, the processing device updates a bin pointer for the block family on the particular die to associate the block family with the voltage bin corresponding to the determined voltage offset. In accordance with the previous example, the processing device can determine that a read operation resulting in the lowest bit rate was performed using a voltage offset associated with voltage bin 4. As such, the processing device can update the bin pointer for the block family on the particular die to associate the block family with voltage bin 4.

In some embodiments, the processing device does not perform the series of read operations using each voltage offset of the set of voltage offsets. Instead, the processing device can perform the series of read operations until the processing device estimates a bit error rate for a particular read operation is the lowest bit error rate for each of the series of read operations. For example, the processing device can perform a series of read operations on a target die for the block family using voltage offsets associated with voltage bins 2-5. In response to determining the bit error rate for a fourth read operation in the series performed using the voltage offset for voltage bin 4 is lower than the bit error rate for a fifth read operation performed using the voltage offset for voltage bin 5, the processing device can determine that the fourth read operation resulted in the lowest bit error rate. As such, the processing device can update a bin pointer for the block family on the target die to associate the block family with voltage bin 4.

Figure 11:
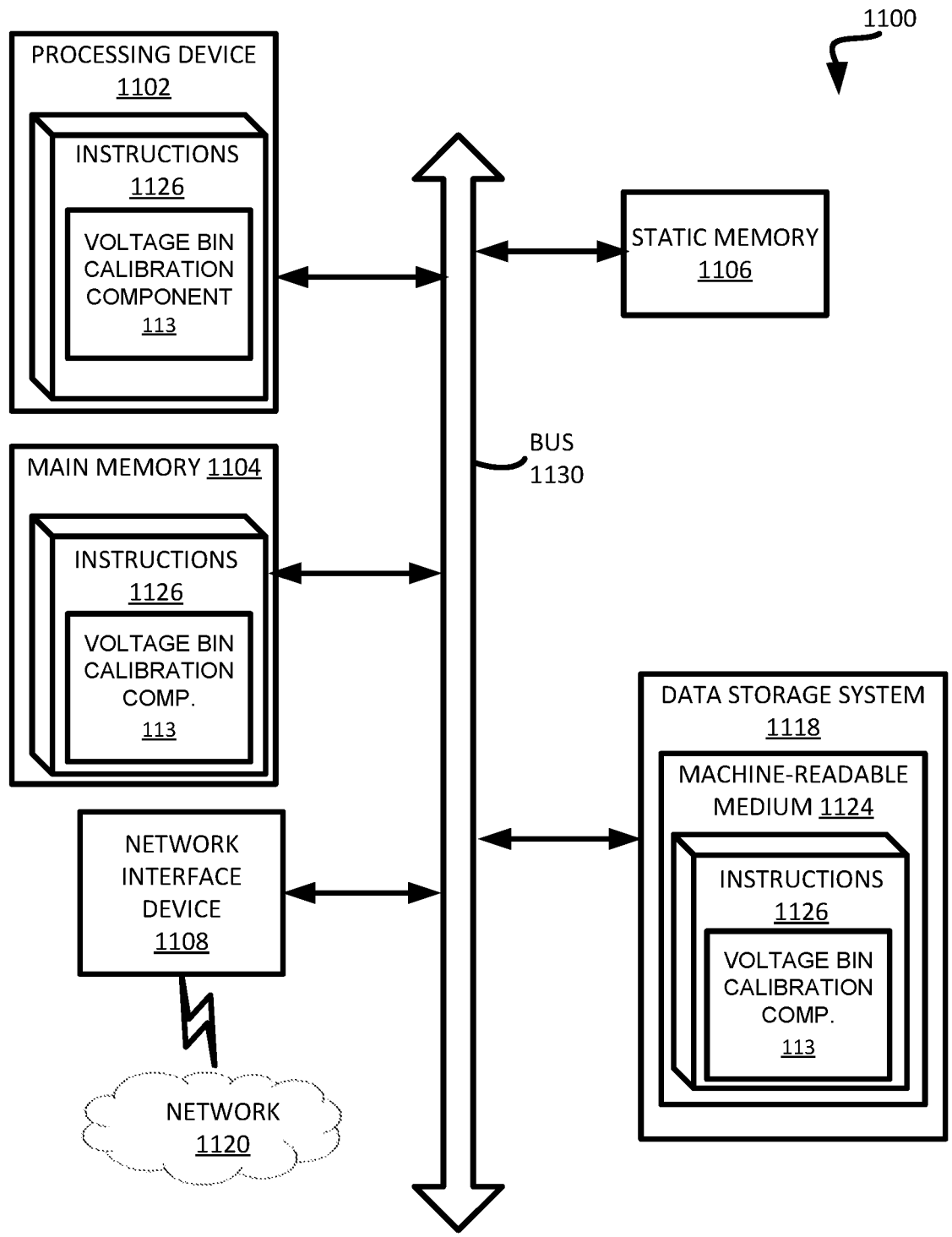
FIG. 11 is a block diagram of an example computer system in which embodiments of the present disclosure may operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage bin calibration component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or RDRAM, etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to a voltage bin boundary component (e.g., the voltage bin calibration component 113 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
identifying a first bin boundary for a first voltage bin associated with a die of a memory device, the first bin boundary corresponding to a first block family associated with the first voltage bin;
determining a first bin boundary offset between the first block family and a second block family; and
updating the first bin boundary based on the first bin boundary offset.

2. The method of claim 1, wherein identifying the first bin boundary for first voltage bin comprises:

identifying the first block family as a least recently created block family of the memory device corresponding to the first voltage bin.

3. The method of claim 1, further comprising:
selecting the die from a set of dies of the memory device based on a determination that a temporal voltage shift for the die is a minimal temporal voltage shift among the set of dies.

4. The method of claim 1, wherein the first bin boundary offset is determined based on a calibration scan performed for the first voltage bin.

5. The method of claim 4, wherein performing the calibration scan for the first voltage bin comprises performing a calibration operation for each of a plurality of block families associated with the first voltage bin, the calibration operation comprising:
performing a series of read operations for a particular block family of the plurality of block families on the die using a set of voltage offsets;
identifying, among the series of read operations, a read operation that resulted in a lowest bit error rate;
determining a voltage offset of the set of voltage offsets that was used to perform the identified read operation; and
update a bin pointer for the block family on the die to associate the block family with the first voltage bin corresponding to the determined voltage offset.

6. The method of claim 1, wherein the first bin boundary offset is determined based on a temporal distance between the first block family and the second block family.

7. The method of claim 1, further comprising:
updating a block family metadata table to associate the second block family with the updated first bin boundary for the first voltage bin.

8. The method of claim 7, further comprising:
receiving a request to read data from a block of the second block family;
determining a threshold voltage offset associated with the second block family based on the update to the block family metadata table;
computing a modified threshold voltage by applying the threshold voltage offset to a base read level associated with the memory device; and
reading, using the modified threshold voltage, data from the block of the second block family.

9. A system comprising:
a memory device comprising dies; and
a processing device coupled to the memory device, the processing device to perform operations comprising:
identifying a first bin boundary for a first voltage bin associated with a die of the memory device, the first bin boundary corresponding to a first block family associated with the first voltage bin;
determining a first bin boundary offset between the first block family and a second block family; and
updating the first bin boundary based on the first bin boundary offset.

10. The system of claim 9, wherein identifying the first bin boundary for first voltage bin comprises:
identifying the first block family as a least recently created block family of the memory device corresponding to the first voltage bin.

11. The system of claim 9, wherein the operations further comprise:

selecting the die from a set of dies of the memory device based on a determination that a temporal voltage shift for the die is a minimal temporal voltage shift among the set of dies.

12. The system of claim 9, wherein the first bin boundary offset is determined based on a calibration scan performed for the first voltage bin.

13. The system of claim 12, wherein performing the calibration scan for the first voltage bin comprises performing a calibration operation for each of a plurality of block families associated with the first voltage bin, the calibration operation comprising:
performing a series of read operations for a particular block family of the plurality of block families on the die using a set of voltage offsets;
identifying, among the series of read operations, a read operation that resulted in a lowest bit error rate;
determining a voltage offset of the set of voltage offsets that was used to perform the identified read operation; and
update a bin pointer for the block family on the die to associate the block family with the first voltage bin corresponding to the determined voltage offset.

14. The system of claim 9, wherein the operations further comprise:
updating a block family metadata table to associate the second block family with the updated first bin boundary for the first voltage bin.

15. The system of claim 14, wherein the operations further comprise:
receiving a request to read data from a block of the second block family;
determining a threshold voltage offset associated with the second block family based on the update to the block family metadata table;
computing a modified threshold voltage by applying the threshold voltage offset to a base read level associated with the memory device; and
reading, using the modified threshold voltage, data from the block of the second block family.

16. A non-transitory computer-readable storage medium comprising instructions that, when executed by a processing device, cause the processing device to perform operations comprising:
identifying a first bin boundary for a first voltage bin associated with a die of a memory device, the first bin boundary corresponding to a first block family associated with the first voltage bin;
determining a first bin boundary offset between the first block family and a second block family; and
updating the first bin boundary based on the first bin boundary offset.

17. The non-transitory computer-readable storage medium of claim 16, wherein identifying the first bin boundary for first voltage bin comprises:
identifying the first block family as a least recently created block family of the memory device corresponding to the first voltage bin.

18. The non-transitory computer-readable storage medium of claim 16, wherein the operations further comprise:
selecting the die from a set of dies of the memory device based on a determination that a temporal voltage shift for the die is a minimal temporal voltage shift among the set of dies.

19. The non-transitory computer-readable storage medium of claim 16, wherein the first bin boundary offset is determined based on a calibration scan performed for the first voltage bin.

20. The non-transitory computer-readable storage medium of claim 19, wherein performing the calibration scan for the first voltage bin comprises performing a calibration operation for each of a plurality of block families associated with the first voltage bin, the calibration operation comprising:
- performing a series of read operations for a particular block family of the plurality of block families on the die using a set of voltage offsets;
- identifying, among the series of read operations, a read operation that resulted in a lowest bit error rate;
- determining a voltage offset of the set of voltage offsets that was used to perform the identified read operation; and
- update a bin pointer for the block family on the die to associate the block family with the first voltage bin corresponding to the determined voltage offset.

* * * * *